United States Patent
Oh et al.

(10) Patent No.: US 9,093,524 B2
(45) Date of Patent: Jul. 28, 2015

(54) VERTICAL-TYPE SEMICONDUCTOR APPARATUS AND FABRICATION METHOD THEREOF

(71) Applicant: SK hynix Inc., Gyeonggi-do (KR)

(72) Inventors: Dong Yean Oh, Gyeonggi-do (KR);
Kang Sik Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/185,495

(22) Filed: Feb. 20, 2014

(65) Prior Publication Data

US 2015/0145031 A1    May 28, 2015

(30) Foreign Application Priority Data

Nov. 27, 2013   (KR) .................. 10-2013-0145242

(51) Int. Cl.
*H01L 27/108*    (2006.01)
*H01L 29/78*    (2006.01)
*H01L 29/66*    (2006.01)
*H01L 29/423*    (2006.01)

(52) U.S. Cl.
CPC ........ *H01L 29/7827* (2013.01); *H01L 29/4236* (2013.01); *H01L 29/66666* (2013.01)

(58) Field of Classification Search
CPC ..................................................... H01L 27/108
USPC .................................. 257/306, 334, E27.084
See application file for complete search history.

(56) References Cited

U.S. PATENT DOCUMENTS

| 2012/0135573 A1* | 5/2012 | Kim .............................. 438/270 |
| 2014/0252459 A1* | 9/2014 | Yu et al. ........................ 257/330 |

FOREIGN PATENT DOCUMENTS

KR    1020090098733    9/2009

* cited by examiner

*Primary Examiner* — Marc Armand
(74) *Attorney, Agent, or Firm* — IP & T Group LLP

(57) ABSTRACT

A semiconductor apparatus includes a semiconductor substrate including first and second regions, an inactive region formed in the semiconductor substrate of the second region and from a surface thereof, one or more first pillars vertically extending from the semiconductor substrate of the first region, one or more second pillars vertically extending from the inactive region, a gate conductive layer formed on the semiconductor substrate and surrounding the first and second pillars, and a gate contact formed on at least one of the second pillars to be coupled to the gate conductive layer, wherein the at least one of the second pillars has a height lower than the gate conductive layer.

19 Claims, 16 Drawing Sheets

VERTICAL-TYPE SEMICONDUCTOR APPARATUS AND FABRICATION METHOD THEREOF

CROSS-REFERENCES TO RELATED APPLICATION

This application claims priority under 35 U.S.C. 119(a) to Korean application No. 10-2013-0145242, filed on Nov. 27, 2013, in the Korean intellectual property Office, which is incorporated by reference in its entirety as set forth in full.

BACKGROUND

1. Technical Field

Various embodiments of the inventive concept relate to a semiconductor apparatus, and more particularly, to a vertical-type semiconductor apparatus, and a fabrication method thereof.

2. Related Art

Semiconductor memory apparatuses are designed to fleet the demands on high integration, ultra miniaturization, or the like, and one of such apparatuses is a vertical-type semiconductor apparatus.

In the vertical-type semiconductor apparatus, a transistor used as a selection device of a memory cell is initially developed to have a vertical channel. The vertical transistor is fabricated in a surround type, all-around type, or the like.

FIG. 1 is a layout diagram illustrating a general vertical-type semiconductor apparatus, and FIGS. 2 and 3 are cross-sectional views illustrating the semiconductor apparatus of FIG. 1. Specifically, FIGS. 2 and 3 are cross-sectional views taken along lines X1-X2 of FIG.

Referring to FIGS. 1 and 2, a plurality of pillars 103 are formed on a semiconductor substrate 101. A gate insulating layer 105 is formed on an outer circumference of each pillar 103 to have a given height, and a gate conductive layer 107 is formed to surround the gate insulating layer 105. For separation between word lines, the gate conductive layer 107 is patterned as a line type in a first direction, for example, an X1-X2 direction.

A semiconductor substrate 101 below the pillar 103 serves as a common source region, and an upper portion of the pillar 103, which is not surrounded with the gate conductive layer 107, serves a drain region.

Operation voltages are to be applied to the gate conductive layer 107 and the common source region, and to this end, a gate contact region 109 and a source contact region 111 are defined.

In order to form a gate contact in the gate contact region 109, any one pillar formed in the gate contact region 109 is removed to form a gate contact hole after the gate conductive layer 107 is patterned in a word line direction. An insulating material is buried in the gate contact hole and then recessed.

A conductive material is buried on the recessed insulating material in the gate contact hole to form a gate contact 109A.

A source contact 111A may be formed by removing a structure formed on the semiconductor substrate 101 of the source contact region 111 to expose the semiconductor substrate 101, forming an insulating layer, forming a source contact hole exposing the semiconductor substrate 101, and burying a conductive material in the source contact hole.

An insulating material having a certain thickness is to exist between the gate contact 109A and the semiconductor substrate 101. That is, as illustrated in FIG. 2, the gate contact 109A is electrically coupled to the gate conductive layer 107, but insulated from the semiconductor substrate 101 as the common source region by the insulating material.

However, when the thickness of the insulating material remaining after the recess is not precisely controlled by an error on a process, the gate contact 109A is in contact with the silicon substrate 101 indicated by "A" of FIG. 3, and thus a short circuit occurs.

SUMMARY

According to an exemplary embodiment, a semiconductor apparatus may include a semiconductor substrate including first and second regions, an inactive region formed in the semiconductor substrate of the second region and from a surface thereof one or more first pillars vertically extending from the semiconductor substrate of the first region, one or more second pillars vertically extending from the inactive region, a gate conductive layer formed on the semiconductor substrate and surrounding the first and second pillars, and a gate contact formed on at least one of the second pillars to be coupled to the gate conductive layer, wherein the at least one of the second pillars has a height lower than the gate conductive layer.

According to another exemplary embodiment, a semiconductor apparatus may include a semiconductor substrate including first and second regions, one or more channel pillars vertically extending from the semiconductor substrate of the first region, one or more insulating pillars vertically extending from the semiconductor substrate of the second region, an inactive region formed to surround lower ends of the channel and insulating pillars, a gate conductive layer formed on the inactive region and surrounding the channel and insulating pillars, and a gate contact formed on at least one of the insulating pillars to be coupled to the gate conductive layer, wherein the at least one of the insulating pillars has a height lower than the gate conductive layer and higher than the surface of the semiconductor substrate.

According to an exemplary embodiment, a method of fabricating a semiconductor device may include forming an inactive region having a first depth in a semiconductor substrate and from a surface thereof, forming hard mask patterns on the semiconductor substrate including the inactive region and forming a plurality of pillars by patterning the semiconductor substrate and the inactive region to a second depth, forming a gate conductive layer on an outer circumference of each of the plurality of pillars, forming a first insulating layer on the semiconductor substrate including the gate conductive layer and planarizing the first insulating layer, forming a gate contact hole by etching at least one of pillars formed on the inactive region to have a height lower than the gate conductive layer, and forming a gate contact by burying a conductive material in the gate contact hole.

According to an exemplary embodiment, a method of fabricating a semiconductor device may include forming hard mask patterns on a semiconductor substrate in which a first region and a second region are defined and forming a plurality of pillars by patterning the semiconductor substrate, forming an inactive region of a first height to surround a lower end of each of the plurality of pillars, forming a gate conductive layer of a second height on the inactive region to surround the pillar, forming an insulating layer on the semiconductor substrate including the gate conductive layer and planarizing the insulating layer, forming a gate contact hole by etching at least one of pillars formed in the second region to have a height lower than the gate conductive layer, and forming a gate contact by burying a conductive material in the gate contact hole.

These and other features, aspects and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
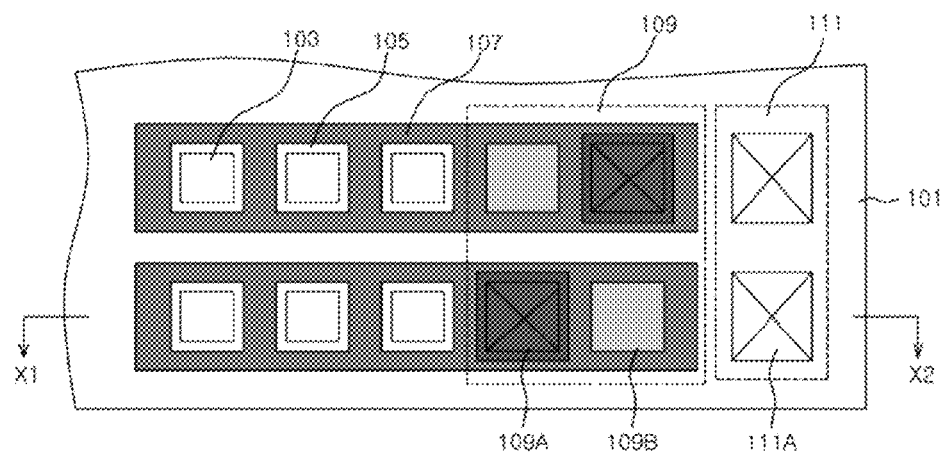
FIG. 1 is a layout diagram illustrating a general vertical-type semiconductor apparatus.
Figure 2:
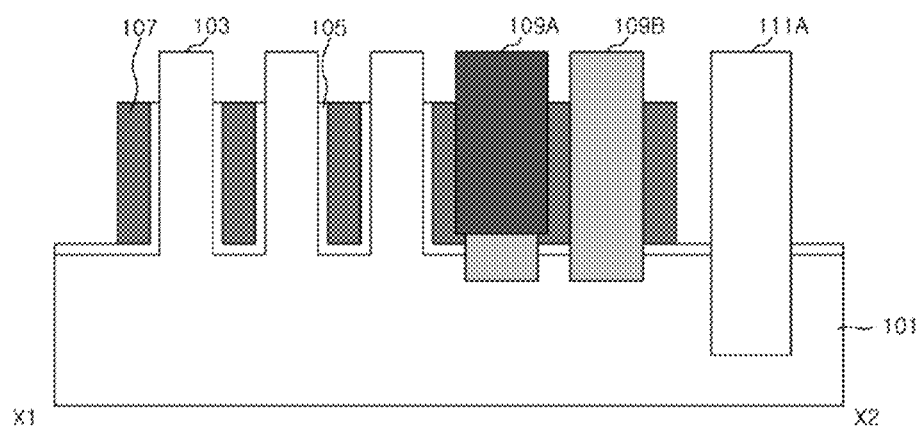
FIGS. 2 and 3 are cross-sectional views of the semiconductor apparatuses of FIG. 1.
Figure 3:
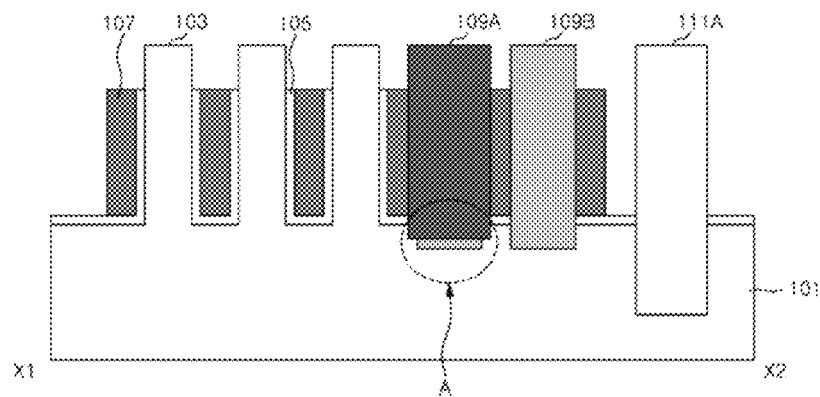

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

The inventive concept is described herein with reference to cross-section and/or plan illustrations that are schematic illustrations of idealized embodiments of the inventive concept. However, embodiments of the inventive concept should not be construed to limit the inventive concept. Although a few embodiments of the inventive concept will be shown and described, it will be appreciated by those of ordinary skill in the art that changes may be made in these exemplary embodiments without departing from the principles and spirit of the inventive concept.

Figure 4:
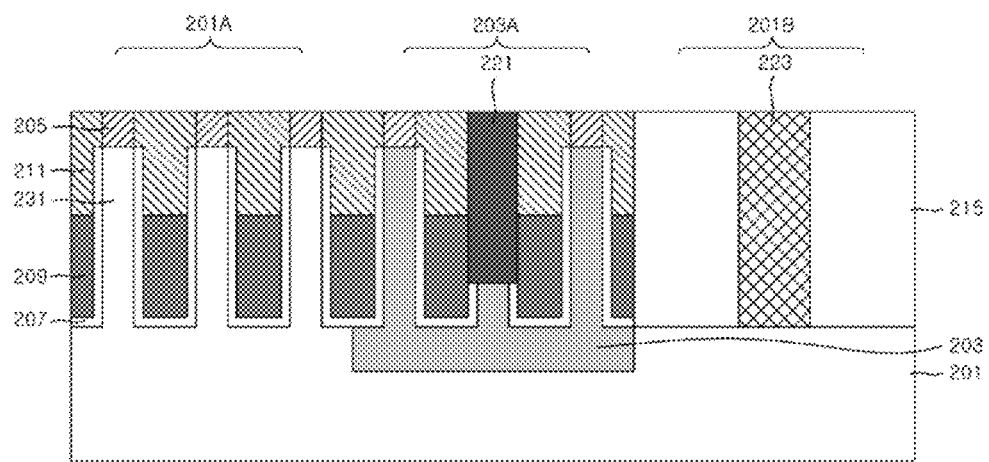
FIG. 4 is a cross-sectional view illustrating a vertical-type semiconductor apparatus according to an embodiment of the inventive concept.

FIG. 4 is a cross-sectional view illustrating a vertical-type semiconductor apparatus according to an embodiment of the inventive concept.

Referring to FIG. 4, a vertical-type semiconductor apparatus according to an embodiment of the inventive concept may include a semiconductor substrate 201 in which a first region 201A, a second region 203A, and a third region 201B are defined. For example, the first region 201A may be a device formation region, the second region 203A may be a gate contact region, and the third region 201B may be a source contact region.

At least one pillar 231 vertically extending from the semiconductor substrate 201 is provided in the first region 201A, and the gate conductive layer 209 having a given height is formed on an outer circumference of the pillar 231 with a gate insulating layer 207 interposed between the gate conductive layer 209 and the pillar 231. The height of the gate conductive layer 209 may be lower than that of the pillar 231, and the gate conductive layer 209 may be formed to horizontally extend to the second region 203A. The reference numeral 205 may denote a hard mask pattern, and the reference numeral 211 may denote a first insulating layer.

An inactive region 203 is formed downward from a surface of the semiconductor substrate 201 in a given size (a width, a depth, and a length) in the second region 203A. The inactive region 203 includes at least one pillar vertically extending from the surface of the semiconductor substrate 201 upward. At least one of the at least one pillar extending from the active region 203, for example a pillar for a gate contact may have a height higher than the surface of the semiconductor substrate 201 and lower than that of the gate conductive layer 209. A gate contact 221 electrically coupled to a side all of the gate conductive layer 209 is formed on the pillar for a gate contact.

A source contact 223, which is electrically coupled to the semiconductor substrate 201 and vertically formed from the surface of the semiconductor substrate 201 upward, is formed in the third region 201B.

Accordingly, the gate contact 221 is formed on the inactive region 203, and the source contact 223 is formed on the semiconductor substrate 201 as an active region.

In the embodiment of the inventive concept, the second region 203A may be defined to be adjacent to the first region 201A in a horizontal direction, and the third region 201B may be defined to be adjacent to the second region 203A in the horizontal direction.

In the semiconductor apparatus illustrated in FIG. 4, the semiconductor substrate 201 may serve as a common source region, an upper end of the pillar formed in the first region 201A may serve as a drain region, and a portion of the pillar formed in the first region 201A overlapping the gate conductive layer 209 may serve as a channel region.

The gate conductive layer 209 extends from the first region 201A to the second region 203A to be in contact with the gate contact 221, and a gate voltage is applied to the gate conductive layer 209 through an interconnection layer to be formed on the gate contact 221. Further, a source voltage is applied to the semiconductor substrate 201 through an interconnection layer to be formed on the source contact 223 formed in the third region 201B.

The semiconductor apparatus illustrated in FIG. 4 may operate as a vertical type, specifically, a vertical channel type transistor.

FIGS. 5 to 13 are cross-sectional views illustrating a method of fabricating the vertical-type semiconductor apparatus according to an embodiment of the inventive concept.

Figure 5:
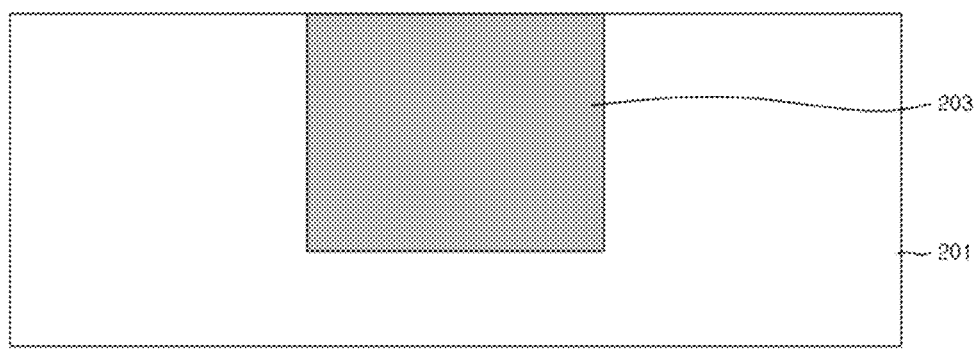
FIGS. 5 to 13 are cross-sectional views illustrating a method of fabricating the vertical-type semiconductor apparatus according to an embodiment of the inventive concept.
Figure 6:
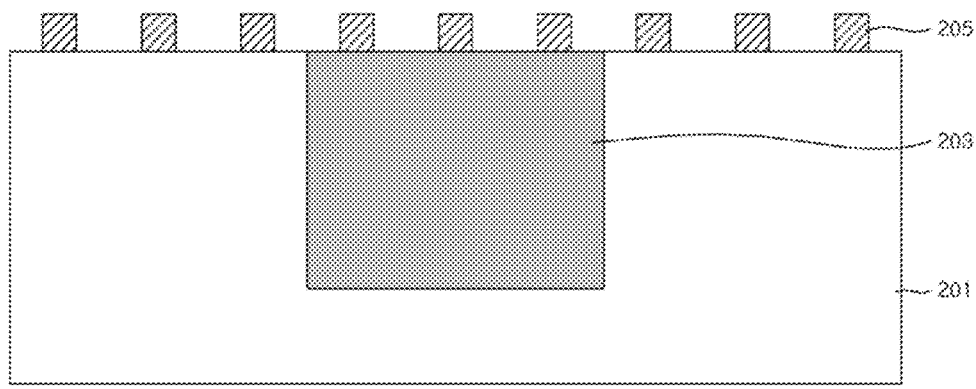

As illustrated in FIG. 5, an inactive region 203 is formed in a given region of a semiconductor substrate 201 to have a given size (a width, a depth, and a length) downward from a surface of the semiconductor substrate 201. The semiconductor substrate 201 other than the inactive region 203 may be called an active region. As illustrated in FIG. 6, a hard mask pattern 205 is formed on the semiconductor substrate 201 including the inactive region 203. The hard mask pattern 205 may be formed in pillar formation region to be described later.

Figure 7:
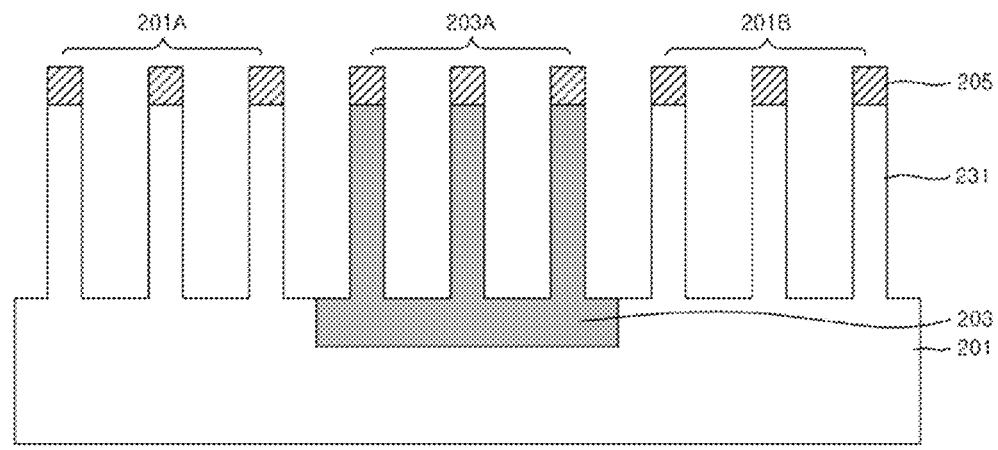

As illustrated in FIG. 7, the semiconductor substrate 201 and the inactive region 203 are patterned to a predetermined depth using the hard mask pattern as an etch mask to form a plurality of pillars. At this time, the patterning depth may be determined to a depth smaller than that of the bottom of the inactive region 203 on the basis of the surface of the semiconductor substrate 201. Therefore, a first region 201A as a device formation region, a second region 203A as a gate contact region, and a third region 201B as a source contact region may be defined in the semiconductor substrate 201.

Figure 8:
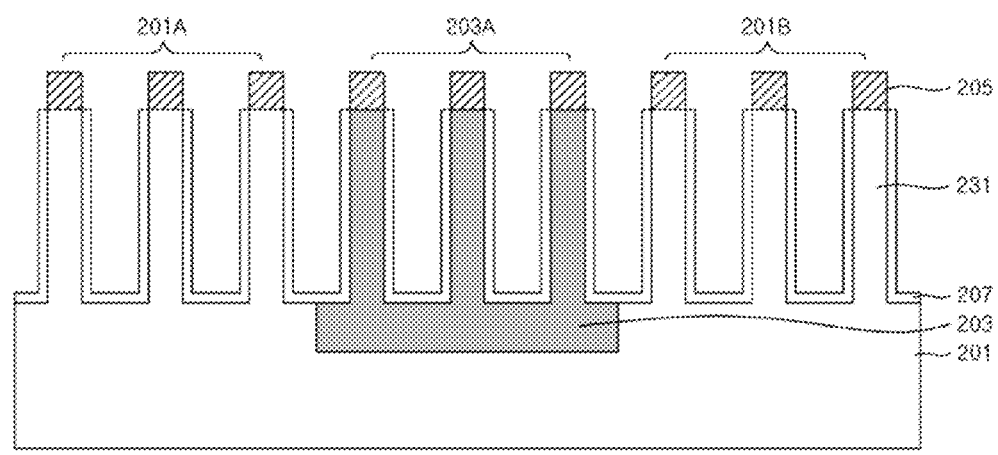

FIG. 8 illustrates that a gate insulating layer 207 is formed on the surface of the semiconductor substrate 201, a surface of the inactive region 203, and outer circumferences of the plurality of pillars.

Figure 9:
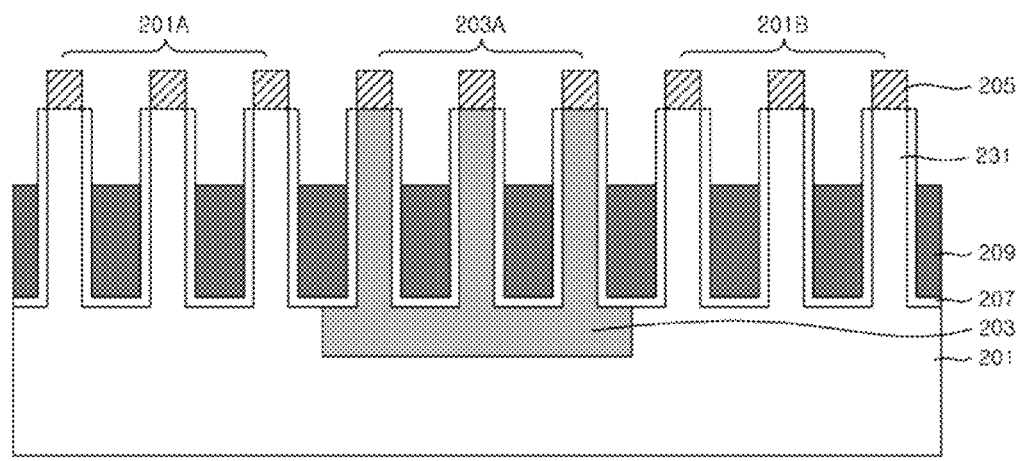

FIG. 9 illustrates that a gate conductive layer 209 having a given height is formed on the outer circumference of each pillar by forming a gate conductive material on the semiconductor substrate 201 including the gate insulating layer 207 and recessing the gate conductive material. After the gate conductive layer 209 is formed, the gate conductive layer 209 is patterned as a line type in a first direction, for example, a word line direction, thereby obtaining separation between word lines.

Figure 10:
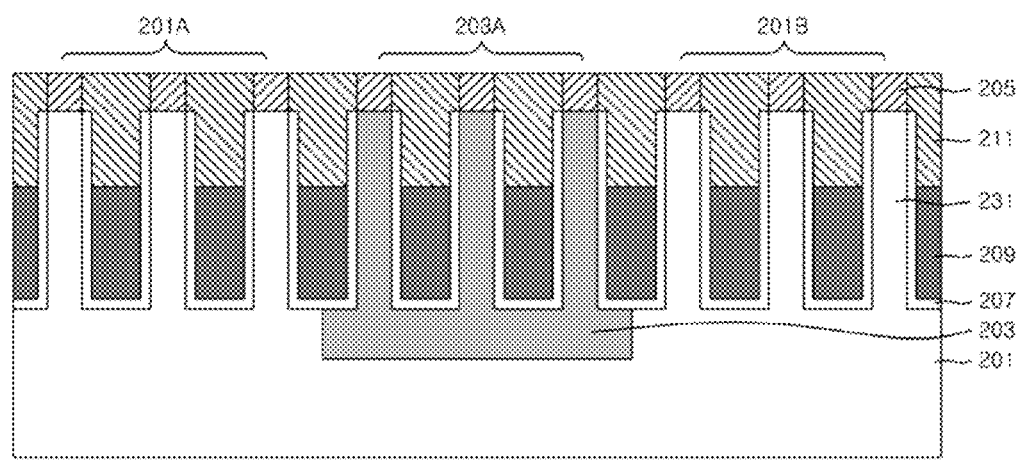

FIG. 10 illustrates that a first insulating layer 211 is formed to be buried in the semiconductor substrate in which patterned gate conductive layers 209 are separated, and then planarized. At this time, an insulating layer to be buried between the gate conductive layers 209 may be used separately from an insulating layer to be buried on the gate conductive layers 209, that is, between the pillars.

Figure 11:
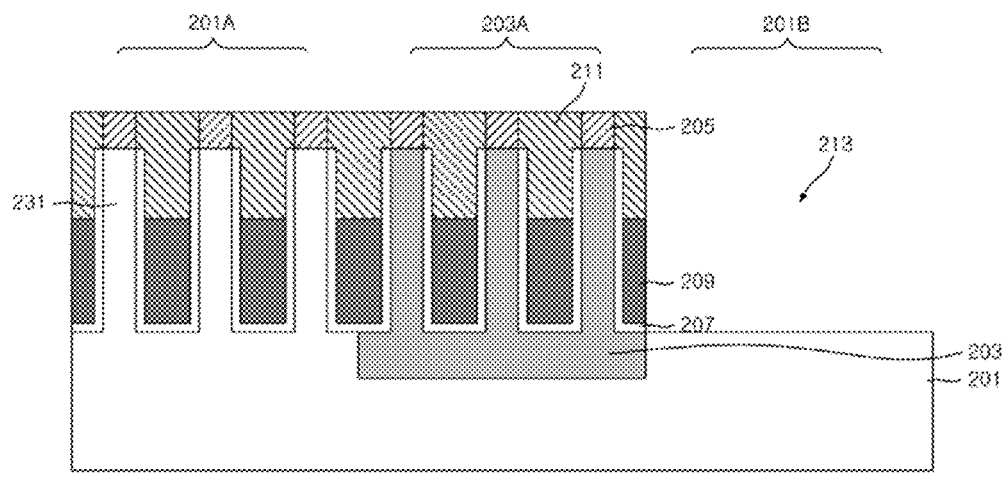
Figure 12:
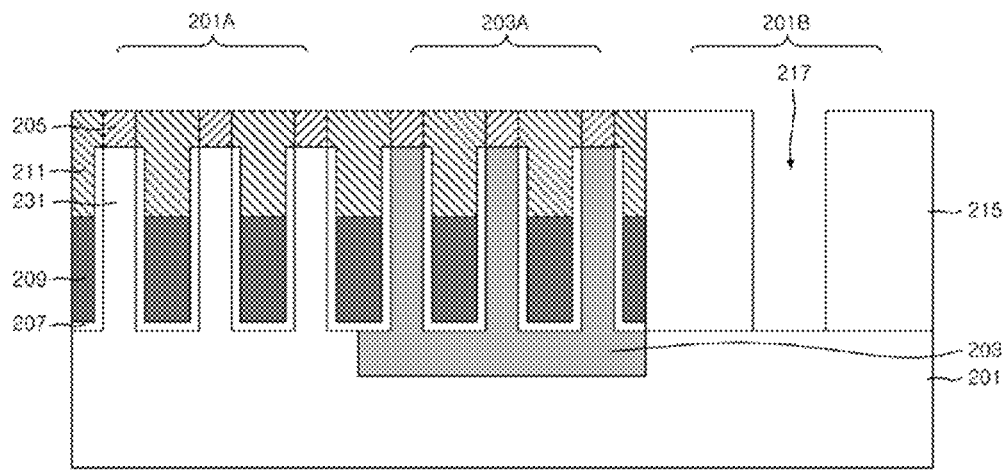

As illustrated in FIG. 11, a structure formed on the semiconductor substrate 201 of the third region 201B is removed to expose the semiconductor substrate 201. As illustrated in FIG. 12, a second insulating layer 215 is formed on the semiconductor substrate 201 of the third region 201B, and a source contact hole 217 exposing the surface of the semiconductor substrate 201 is formed.

Figure 13:
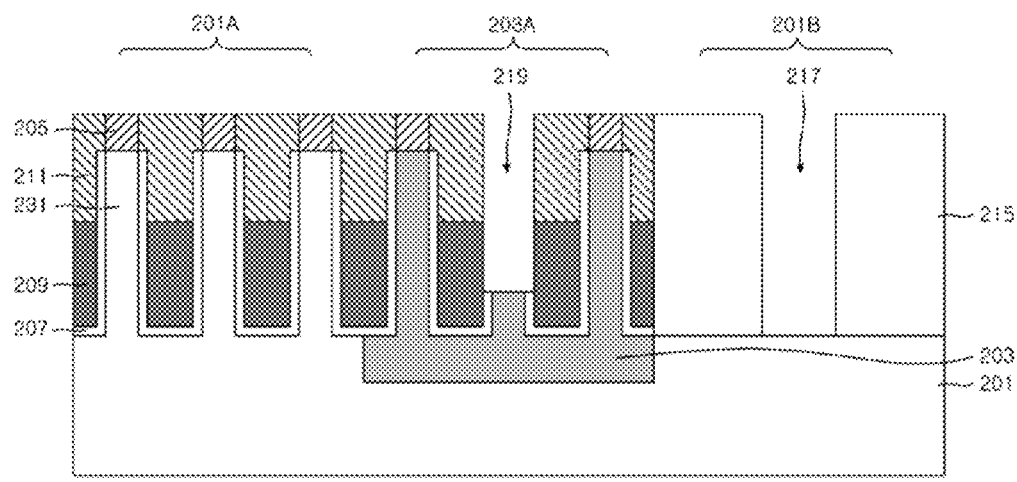

As illustrated in FIG. 13, any one of pillars formed in the second region 203A, for example, a pillar for a gate contact is selectively removed to have a given height, for example, a height sufficient to expose a side of the gate conductive layer 209, thereby forming a gate contact hole 219. That is, the pillar for a gate contact may be removed to have the height higher than the surface of the semiconductor substrate 201 and lower than that of the gate conductive layer 209.

A conductive material is buried in the source contact hole 217 and the gate contact hole 219 and then planarized to form a gate contact 221 and a source contact 223. The gate contact 221 and the source contact 223 are formed as illustrated in FIG. 4.

In the embodiment, before the forming of the pillars, the inactive region 203 is formed in the semiconductor substrate 201 of the second region 203A to have a sufficient depth, for example, the depth larger than a depth to which the pillar is formed. Therefore, the gate contact 221 is vertically formed on the inactive region 203, and thus a short circuit between a gate terminal and a source terminal may be prevented.

The vertical-type semiconductor apparatus illustrated FIG. 4 may serve as a transistor, and thus, a data storage unit may be formed on the transistor to constitute a memory apparatus.

Figure 14A:
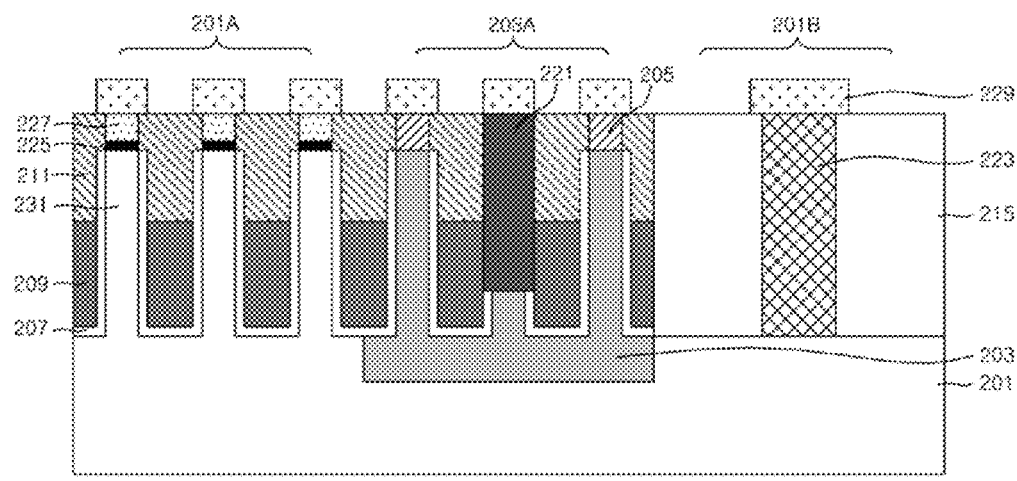
FIGS. 14A and 14B are diagrams illustrating a semiconductor memory apparatus employing the vertical-type semiconductor apparatus illustrated in FIG. 4.
Figure 14B:
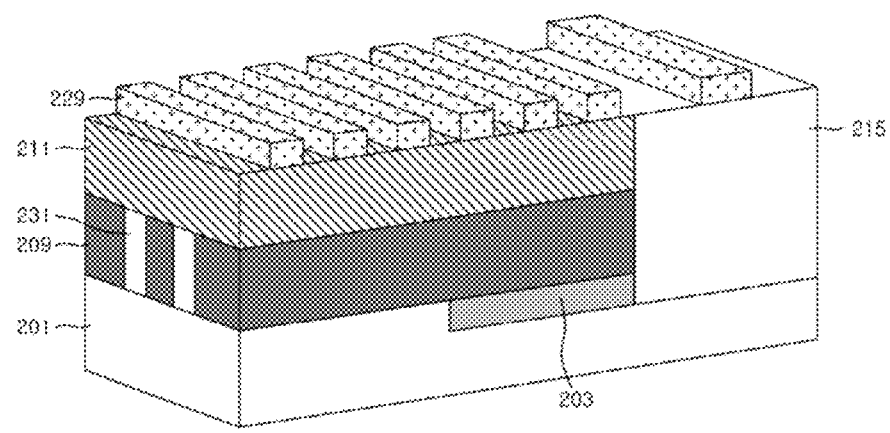

FIGS. 14A and 14B are diagrams illustrating a semiconductor memory apparatus employing the vertical-type semiconductor apparatus illustrated in FIG. 4. FIG. 14A illustrates a cross-sectional view of the semiconductor memory apparatus and FIG. 14B illustrates a perspective view of the semiconductor memory apparatus.

Referring to FIGS. 14A and 14B, the hard mask pattern 205 is removed from the semiconductor substrate including the gate contact 221 and the source contact 223 as illustrated in FIG. 4, and a data storage unit 225 and 227 is formed in a space from which the hard mask pattern 205 is removed. The data storage unit 225 and 227 may include an electrode 225 and a variable resistive layer 227, but the inventive concept is not limited thereto.

After the data storage unit 225 and 227 is formed, a conductive material is formed on the semiconductor substrate 201 including the data storage unit 225 and 227 and patterned in a second direction, i.e., a direction substantially perpendicular to the first direction, to form interconnection layers 229. The interconnection layers 229 may be patterned to be electrically coupled to the data storage unit 225 and 227, the gate contact 221, and the source contact 223.

The inactive region 203 formed in the semiconductor substrate 201 may prevent the gate contact 221 from being in contact with the semiconductor substrate 201, and thus yield of the semiconductor memory apparatus may be improved.

Figure 15:
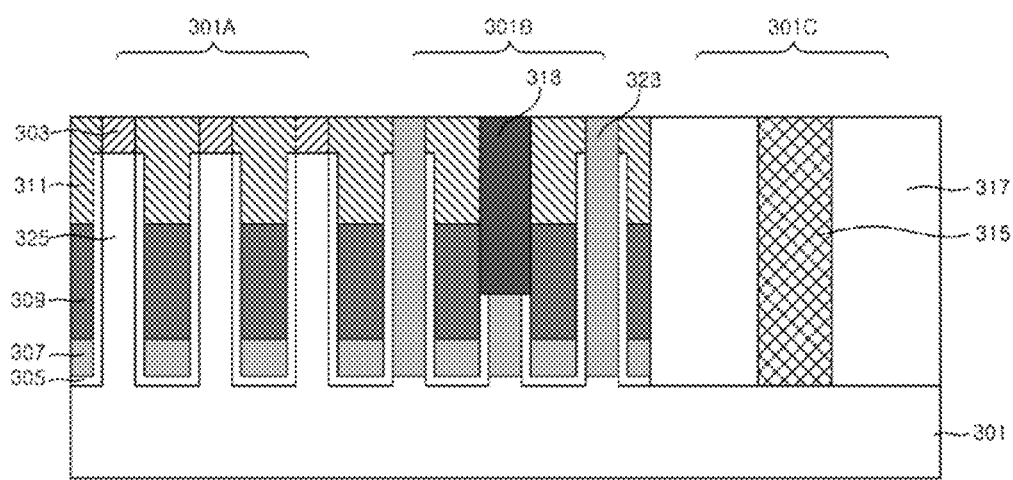
FIG. 15 is a cross-sectional view illustrating a vertical-type semiconductor apparatus according to another embodiment of the inventive concept.

FIG. 15 is a cross-sectional view illustrating a vertical-type semiconductor apparatus according to another embodiment of the inventive concept.

Referring to FIG. 15, a vertical-type semiconductor apparatus according to an embodiment of the inventive concept may include a semiconductor substrate 301 in which a first region 301A, a second region 301B, and a third region 301C are defined. For example, the first region 301A may be a device formation region, the second region 301B may be a gate contact region, and the third region 201C may be a source contact region.

At least one pillar 325 vertically extending from the semiconductor substrate 301 is provided in the first region 301A, and a gate insulating layer 305 is formed on an outer circumference of the pillar 325. An inactive region 307 is formed on an outer circumference of a lower end of the pillar 325 surrounded with the gate insulating layer 305 to have a first height, and a gate conductive layer 309 is formed on the inactive region 307 to have a second height. The reference numeral 303 may denote a hard mask pattern, the reference numeral 311 may denote a first insulating layer, and the reference numeral 317 may denote a second insulating layer.

An insulating pillar 323 is formed vertically from a surface of the semiconductor substrate 301 in the second region 301B. An inactive region 307 is formed on an outer circumference of a lower end of the insulating pillar 323 to have a first height, and a gate conductive layer 309 extending from the first region 301A is formed on the inactive region 307. At least one pillar formed in the second region 301B, for example, a pillar for a gate contact, has a height higher than a surface of the inactive region 307 and lower than that of the gate conductive, layer 309. A gate contact 313 electrically coupled to a sidewall of the gate conductive layer 309 is formed on the pillar for a gate contact.

A source contact 315 is formed in the third region 301C to be electrically coupled to the semiconductor substrate 301 and formed vertically from the surface of the semiconductor substrate 310 upward. Therefore, the gate contact 313 is formed on the insulating pillar 323 surrounded with the inactive region 307 to be insulated from the semiconductor substrate 301, and the source contact 315 is formed to be in contact with the semiconductor substrate 301 as an active region.

In the embodiment of the inventive concept, the second region 301B may be defined to be adjacent to the first region 301A in a horizontal direction, and the third region 301C may be defined to be adjacent to the second region 301B in the horizontal direction.

In the semiconductor apparatus illustrated in FIG. 15, the semiconductor substrate 301 may serve as a common source region, an upper end of the pillar formed in the first region 301A may serve as a drain region, and a portion of the pillar formed in the first region 301A overlapping the gate conductive layer 309 may serve as a channel region.

The gate conductive layer 309 extends from the first region 301A to the second region 301B to be in contact with the gate contact 313, and a gate voltage is applied to the gate conductive layer 309 through an interconnection layer to be formed on the gate contact 313. Further, a source voltage is applied to the semiconductor substrate 301 through an interconnection layer to be formed on the source contact 315 formed in the third region 301C.

Therefore, the semiconductor apparatus illustrated in FIG. 15 may operate as a vertical-type transistor.

FIGS. 16 to 19 are cross-sectional views illustrating a method of fabricating the vertical-type semiconductor apparatus according to an embodiment of the inventive concept.

Figure 16:
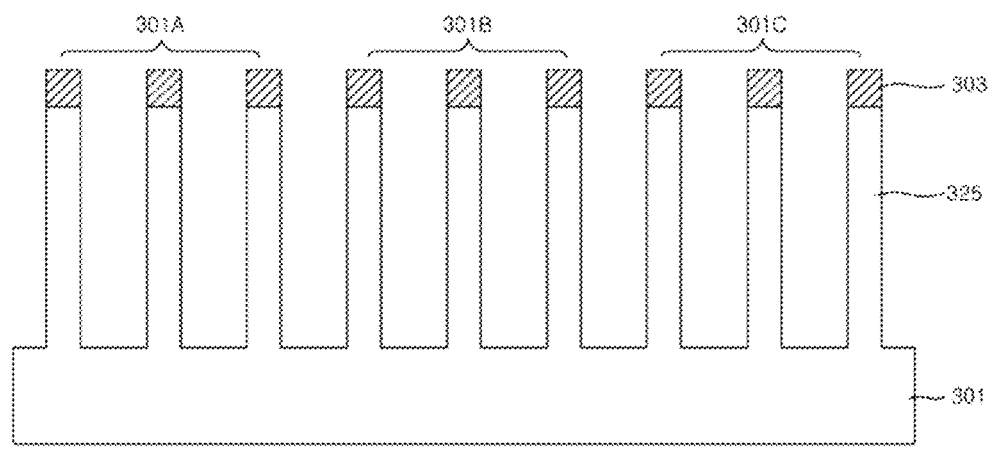
FIGS. 16 to 20 are cross-sectional views illustrating a method of fabricating the vertical-type semiconductor apparatus according to another embodiment of the inventive concept.

As illustrated in FIG. 16, a first region 301A, a second region 301B, and a third region 301C are defined in a semiconductor substrate 301, and a hard mask pattern 303 is formed on a predetermined region of the semiconductor substrate 301, for example, a pillar formation region, and the semiconductor substrate 301 is patterned using the hard mask pattern 303 as an etch mask to form a plurality of pillars.

Figure 17:
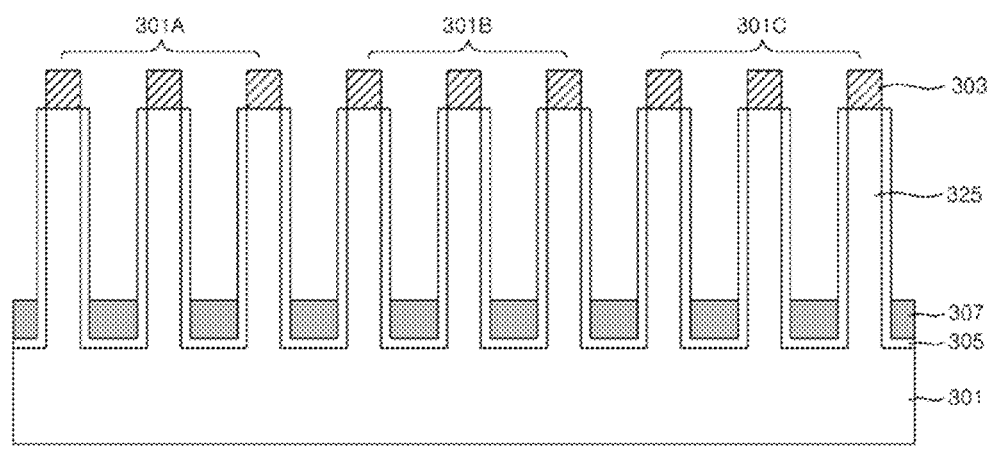

Referring to FIG. 17, a gate insulating layer 305 is formed on an exposed surface of the semiconductor substrate 301, that is, an upper surface of the semiconductor substrate 301 and an outer circumference of each pillar. An inactive region 307 having a first height is formed to surround an outer circumference of a lower end of the pillar.

Figure 18:
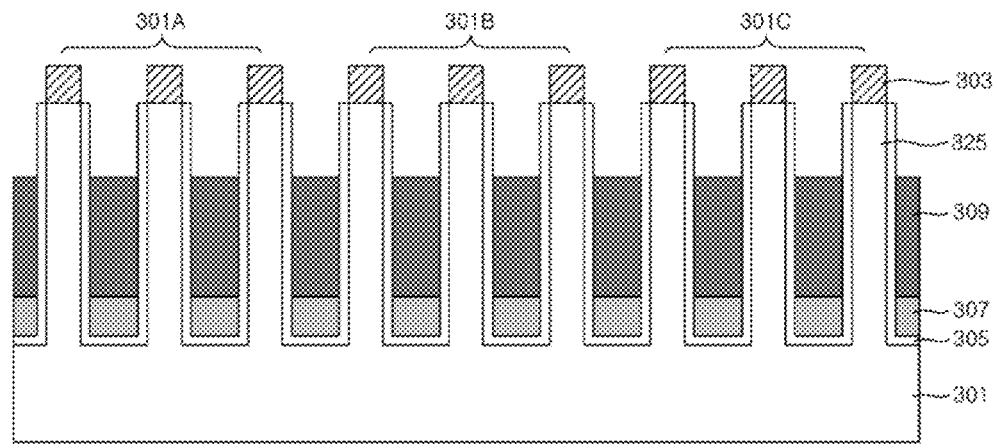

As illustrated in FIG. 18, a gate conductive material is formed on the semiconductor substrate 301 including the inactive region 307 and then recessed to form a gate conductive layer 309 having a predetermined height on the inactive region 307 to surround the outer circumference of the pillar. After the gate conductive layer 209 is formed, the gate conductive layer 209 is patterned as a line type in a first direction, for example, a word line direction thereby obtaining separation between word lines.

Figure 19:
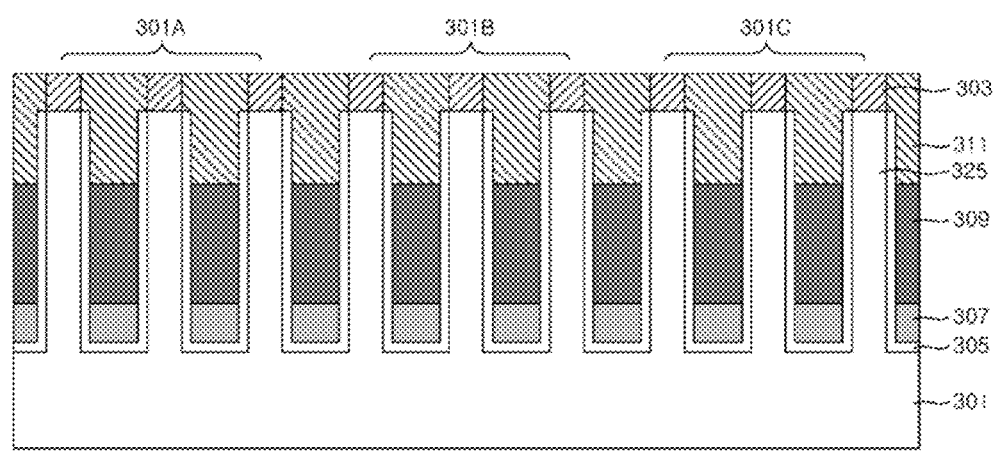

FIG. 19 illustrates that a first insulating layer 311 is formed on the semiconductor substrate 301 including the gate conductive layer 309, and then planarized.

Figure 20:
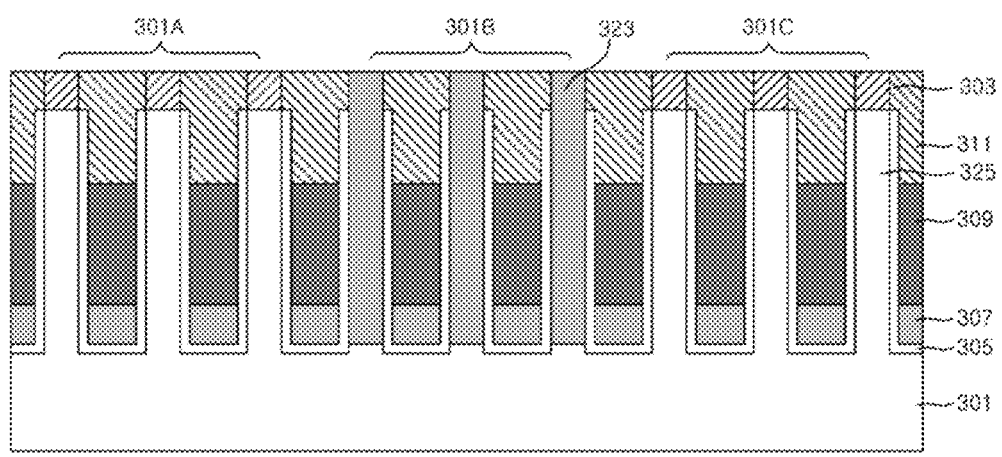

As illustrated in FIG. 20, the hard mask pattern 303 and the pillar formed in the second region 301B are removed, and an insulating material is buried in a space from which the hard mask pattern and the pillar are removed to form an insulating pillar 323. Therefore, the insulating pillar 323 is insulated from the semiconductor substrate 301, and an outer circumference of a lower end of the insulating pillar 323 is surrounded with the inactive region 307.

Subsequently, a gate contact hole and a source contact hole are formed in a similar manner to the method described with reference to FIGS. 11 to 13. After the gate contact hole and the source contact hole are formed, a conductive material is buried to form the gate contact 313 and the source contact 315 as illustrated in FIG. 15.

In the semiconductor apparatus of the embodiment, the gate conductive layer 309 is formed to be spaced apart from the semiconductor substrate 301 by a height of the inactive region 307. The gate contact 313 is formed on the insulating pillar 323 insulated from the semiconductor substrate 301. Therefore, a distance between the gate contact 313 and the semiconductor substrate 301 may be sufficiently ensured to prevent a short circuit.

Figure 21A:
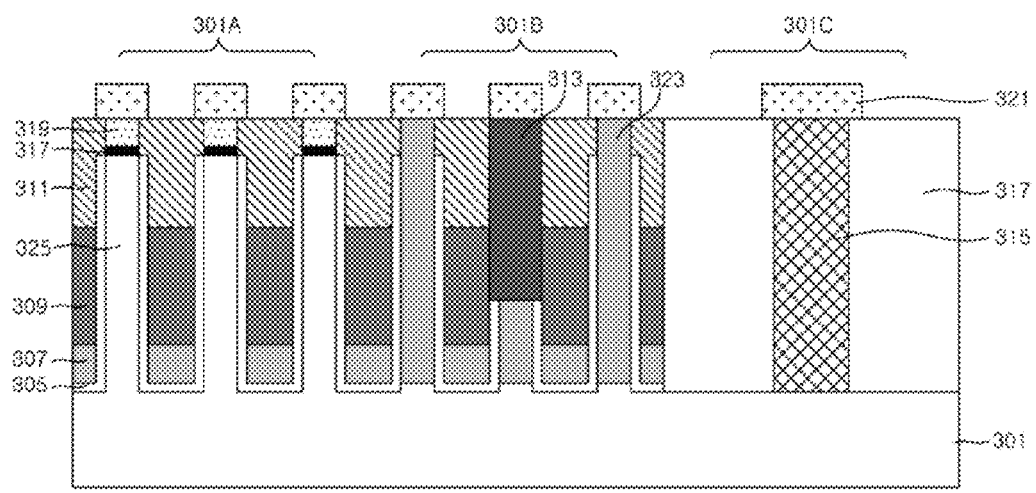
FIGS. 21A and 21B are diagrams illustrating a semiconductor memory apparatus employing the vertical-type semiconductor apparatus illustrated in FIG. 15.
Figure 21B:
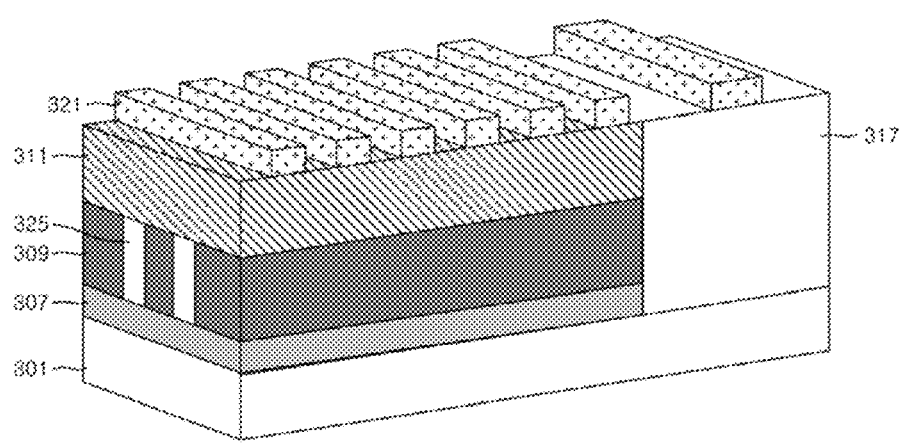

FIGS. 21A and 21B are diagrams illustrating a semiconductor memory apparatus employing the vertical-type semiconductor apparatus illustrated in FIG. 15. FIG. 21A illustrates a cross-sectional view of the semiconductor memory apparatus and FIG. 21B illustrates a perspective view of the semiconductor memory apparatus.

Referring to FIGS. 21A and 21B, a data storage unit 317 and 319 is formed in a space from which a hard mask pattern (see 303 of FIG. 20) of the first region 301A is removed. The data storage unit 317 and 319 may include, for example, an electrode 317 and a variable resistive layer 319, but the inventive concept is not limited thereto.

After the data storage unit 317 and 319 is formed, a conductive material is formed on the semiconductor substrate 301 including the data storage unit 317 and 319, and patterned to form interconnection layers 321. The interconnection layers 321 may be patterned to be electrically coupled to the data storage unit 317 and 319, the gate contact 313, and the source contact 315.

The insulating pillar 323 formed between the semiconductor substrate 301 and the gate contact 313 may prevent the gate contact 313 from being in contact with the semiconductor substrate 301, and thus yield of the semiconductor memory apparatus may be improved.

Figure 22:
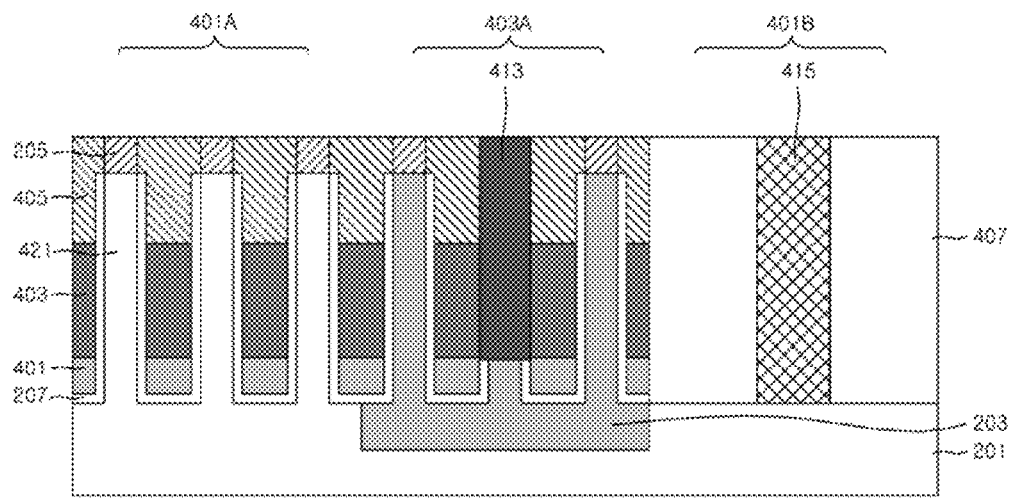
FIG. 22 is a cross-sectional view illustrating a vertical-type semiconductor apparatus according to another embodiment of the inventive concept.

FIG. 22 is a cross-sectional view illustrating a vertical-type semiconductor apparatus according to another embodiment of the inventive concept.

Referring to FIG. 22, a vertical-type semiconductor apparatus according to an embodiment of the inventive concept may include a semiconductor substrate 201 in which a first region 401A, a second region 403A, and a third region 401B are defined. For example, the first region 401A may be a device formation region, the second region 403A may be a gate contact region, and the third region 401B may be a source contact region.

At least one pillar 421 vertically extending from the semiconductor substrate 201 is provided in the first region 401A, and a gate insulating layer 207 is formed on an outer circumference of the pillar 421.

A first insulating layer 401 is formed to have a first height on an outer circumference of a lower end of the pillar surrounded with the gate insulating layer 207 in the first region 401A, and a gate conductive layer 403 is formed to have a second height on the insulating layer 401 to surround an outer circumference of the pillar. The height of the gate conductive layer 403 may be formed lower than that of the pillar, and the gate conductive layer 403 may be formed to horizontally extend to the second region 403A. The reference numeral 205 may denote a hard mask pattern, the reference numeral 405 may denote a first buried insulating layer, and the reference numeral 407 may denote a second buried insulating layer.

An inactive region 203 is formed downward from a surface of the semiconductor substrate 201 to have a predetermined size (a width, a depth, and a length) in the second region 403A. The inactive region 203 includes at least one pillar vertically extending from the surface of the semiconductor substrate 201 upward. A first insulating layer 401 extending from the first region 401A is formed on an outer circumference of a lower end of the pillar formed in the second region 403A, and a gate conductive layer 403 extending from the first region 401A is formed on the first insulating layer 401 to surround an outer circumference of the pillar.

At least one pillar formed in the second region 403A, for example, a pillar for a gate contact, has a height higher than an upper surface of the first insulating layer 401 and lower than that of the gate conductive layer 403. A gate contact 413 electrically coupled to the gate conductive layer 403 is formed on the pillar for a gate contact.

A source contact 415, which is electrically coupled to the semiconductor substrate 201 and vertically formed from the surface of the semiconductor substrate 201, is formed in the third region 401B.

Accordingly, the gate contact 413 is formed on the inactive region 203 surrounded with the first insulating layer 401, and the source contact 415 is formed on a semiconductor substrate 201 as an active region.

In the embodiment of the inventive concept, the second region 403A may be defined to be adjacent to the first region 401A in a horizontal direction, and the third region 401B may be defined to be adjacent to the second region 403A in the horizontal direction.

In the semiconductor apparatus illustrated in FIG. 22, the semiconductor substrate 201 may serve as a common source region, an upper end of the pillar formed in the first region 401A may serve as a drain region, and a portion of the pillar formed in the first region 401A overlapping the gate conductive layer 403 may serve as a channel region.

The gate conductive layer 403 extends from the first region 401A to the second region 403A to be in contact with the gate contact 413, and a gate voltage is applied to the gate conductive layer 403 through an interconnection layer to be formed on the gate contact 413. Further, a source voltage is applied to the semiconductor substrate 201 through an interconnection layer to be formed on the source contact 415 formed in the third region 401B.

The semiconductor apparatus illustrated in FIG. 22 may operate as a vertical-type transistor.

In particular, the gate contact 413 is formed to be spaced apart from the semiconductor substrate 201 by the inactive region 203 and the first insulating layer 401, and thus, a short circuit between a gate terminal and a source terminal may be prevented.

FIGS. 23 to 26 are cross-sectional views illustrating a method of fabricating the vertical-type semiconductor apparatus according to another embodiment of the inventive concept.

To fabricate the vertical-type semiconductor apparatus according to the embodiment, a pillar of which an outer circumference is surrounded with a gate insulating layer 207 may be formed through processes of FIGS. 5 to 8.

Figure 23:
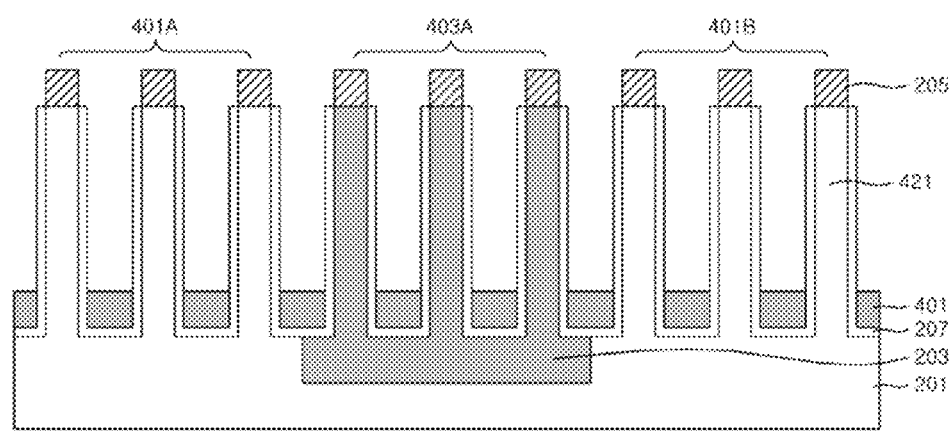
FIGS. 23 to 26 are cross-sectional views illustrating a method of fabricating the vertical-type semiconductor apparatus according to another embodiment of the inventive concept.

Subsequently, as illustrated in FIG. 23, an insulating layer 401 having a first height is formed to surround an outer circumference of a lower end of the pillar.

Figure 24:
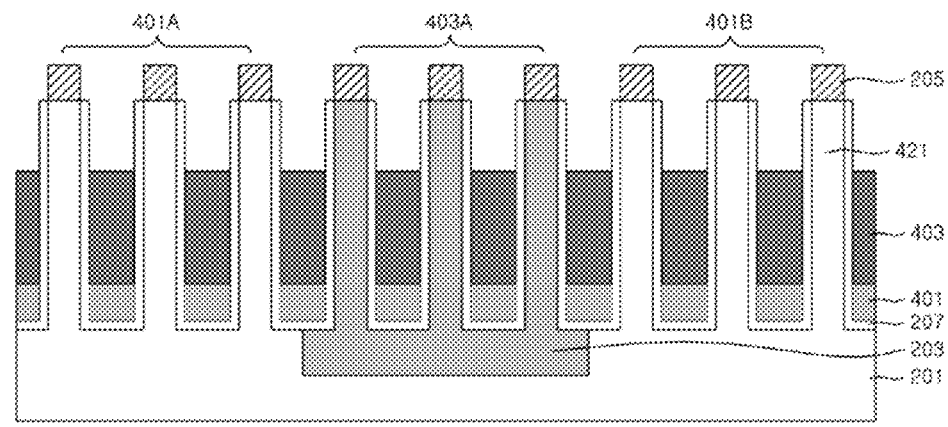

As illustrated in FIG. 24, a gate conductive layer 403 having a second height is formed on the insulating layer 401 to surround the outer circumference of the pillar by forming a gate conductive material on the semiconductor substrate 201 including the insulating layer 401 and recessing the gate conductive material. The gate conductive layer 403 is patterned as a line type in a first direction, for example, a word line direction, thereby obtaining separation between word lines.

Figure 25:
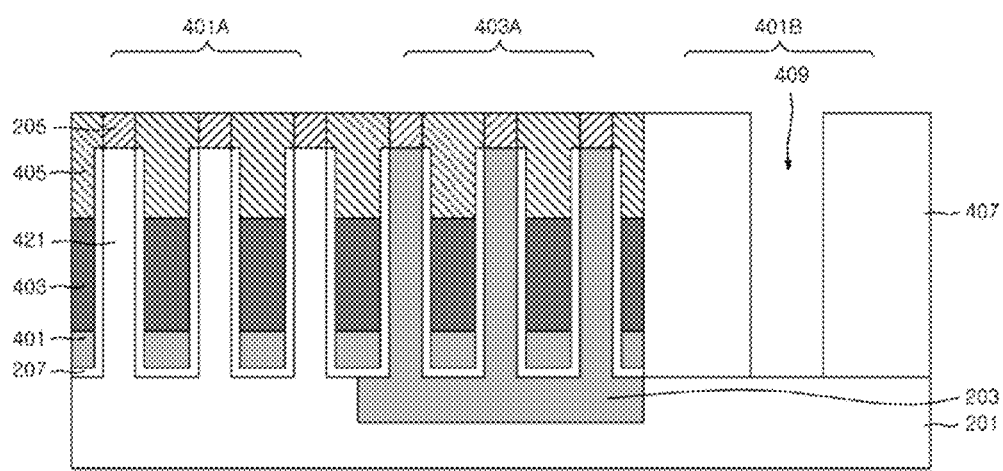

Referring to FIG. 25, a first buried insulating layer 405 is formed on the semiconductor substrate 201 in which patterned gate conductive layers 403 are separated, and then planarized. A structure formed on the semiconductor substrate 201 of the third region 401B is removed to expose the semiconductor substrate 201. Then, a second buried insulating layer 407 is formed on the semiconductor substrate 201 of the third region 401B, and a source contact hole 409 exposing the surface of the semiconductor substrate 201 is formed.

In an embodiment of the inventive concept, the first buried insulating layer 405 may include an insulating layer to be buried between the gate conductive layers 403 and an insulating layer to be buried on the gate conductive layer 403, that is, between pillars, separately.

Figure 26:
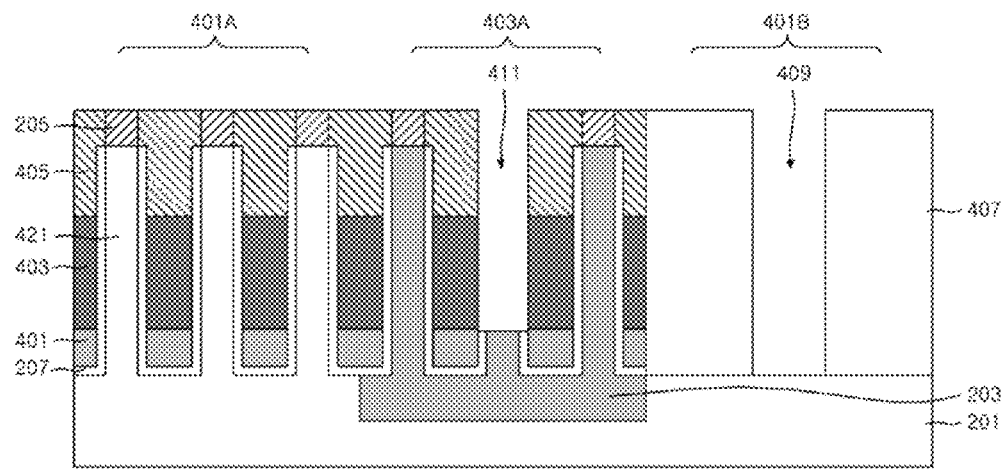

As illustrated in FIG. 26, any one of pillars formed in the second region 403A, for example, a pillar for a gate contact is selectively etched to have a predetermined height, for example, a height sufficient to expose a sidewall of the gate conductive layer 403, thereby forming a gate contact hole 411. In an embodiment of the inventive concept, the pillar for a gate contact may be etched to have the height higher than an upper surface of the insulating layer 401 and lower than that of the gate conductive layer 403.

A conductive material is buried in the source contact hole 409 and the gate contact hole 411 and then planarized to form a gate contact 413 and the source contact 415. The gate contact 413 and the source contact 415 are formed as illustrated in FIG. 22.

In the embodiment, before the forming of the pillars, the inactive region 203 is formed in the semiconductor substrate 201 of the second region 403A to have a sufficient depth, that is, the depth larger than a depth to which the pillar is formed. Further, after the pillar is formed, the insulating layer 401 is formed to surround the outer circumference of the lower end of the pillar. Therefore, the gate contact 413 may be sufficiently spaced apart from the semiconductor substrate 201 by the inactive region 203 and the insulating layer 401, and thus a short circuit between a gate terminal and a source terminal may be prevented.

The vertical-type semiconductor apparatus illustrated FIG. 22 may serve as a transistor, and thus a data storage unit may be formed on the transistor to constitute a memory apparatus.

Figure 27A:
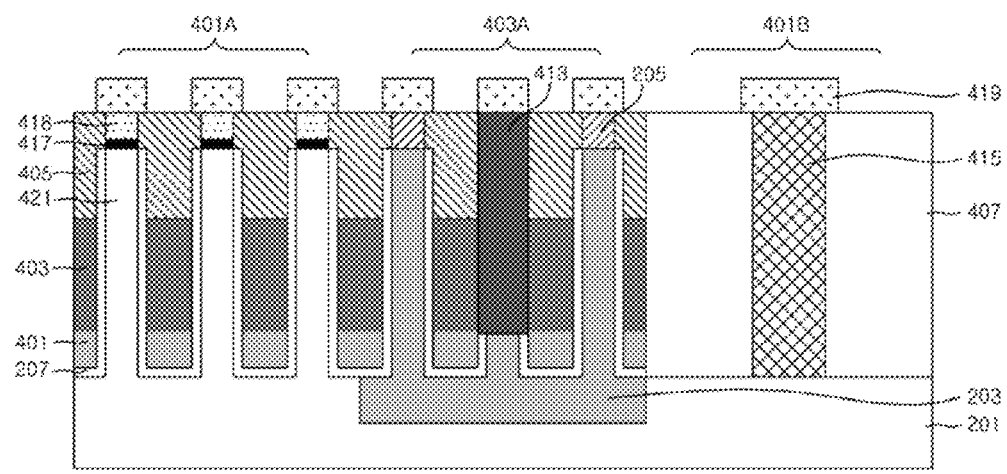
FIGS. 27A and 27B are diagrams illustrating a semiconductor memory apparatus employing the vertical-type semiconductor apparatus illustrated in FIG. 21.
Figure 27B:
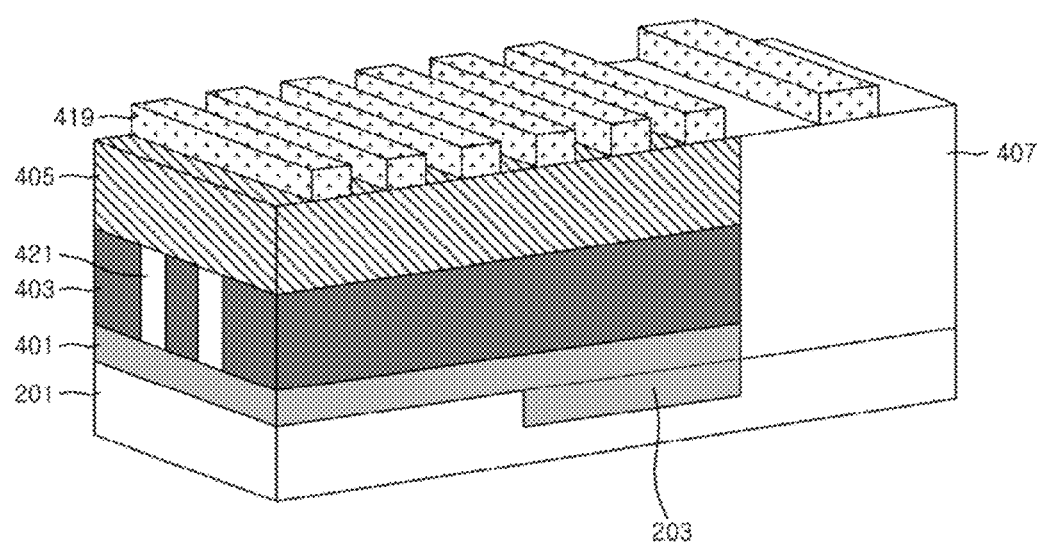

FIGS. 27A and 27B are diagrams illustrating a semiconductor memory apparatus employing the vertical-type semiconductor apparatus illustrated in FIG. 22. FIG. 27A illustrates a cross-sectional view of the semiconductor memory apparatus, and FIG. 27B illustrates a perspective view of the semiconductor memory apparatus.

Referring to FIGS. 27A and 27B a data storage unit 417 and 418 is formed in a space from which a hard mask pattern (see 205 of FIG. 26) of the first region 401A is removed. The data storage unit 417 and 418 may include, for example, an electrode 417 and a variable resistive layer 418, but the inventive concept is not limited thereto.

After the data storage unit 417 and 418 is formed, conductive material is formed on the semiconductor substrate 201 including the data storage unit 417 and 418 and patterned to form interconnection layers 419. The interconnection layers 419 may be patterned to be electrically coupled to the data storage unit 417 and 418, the gate contact 413, and the source contact 415.

In addition to the inactive region 203 formed in the semiconductor substrate 201, the insulating layer 401 surrounding the lower end of the pillar may prevent the gate contact 413 from being in contact with the semiconductor substrate 201, and thus yield of the semiconductor memory apparatus may be improved.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A vertical-type semiconductor apparatus, comprising:
    a semiconductor substrate including first region and second region;
    an inactive region formed in the semiconductor substrate of the second region and formed from a surface thereof;
    one or more first pillars vertically extending from the semiconductor substrate of the first region;
    one or more second pillars vertically extending from the inactive region;
    a gate conductive layer formed on the semiconductor substrate and surrounding the first and second pillars; and
    a gate contact formed on at least one of the second pillars to be coupled to the gate conductive layer,
    wherein the at least one of the second pillars has a height lower than the gate conductive layer.

2. The vertical-type semiconductor apparatus of claim 1, further comprising:
    a source contact electrically coupled to the semiconductor substrate and vertically extending from the surface of the semiconductor substrate, in a third region of the semiconductor substrate.

3. The vertical-type semiconductor apparatus of claim 2, wherein the second region is defined to be adjacent to the first region in a horizontal direction, and the third region is defined to be adjacent to the second region in the horizontal direction.

4. The vertical-type semiconductor apparatus of claim 1, further comprising:
    one or more data storage units formed on the first pillars.

5. The vertical-type semiconductor apparatus of claim 4, wherein the data storage unit includes a variable resistive layer.

6. The vertical-type semiconductor apparatus of claim 1, further comprising:
    an insulating layer formed between the semiconductor substrate and the gate conductive layer to surround lower ends of the first and second pillars.

7. A vertical-type semiconductor apparatus, comprising:
    a semiconductor substrate including first and second regions;
    one or more channel pillars vertically extending from the semiconductor substrate of the first region;
    one or more insulating pillars vertically extending from the semiconductor substrate of the second region;
    an inactive region formed to surround lower ends of the channel and insulating pillars;
    a gate conductive layer formed on the inactive region and surrounding the channel and insulating pillars; and
    a gate contact formed on at least one of the insulating pillars to be coupled to the gate conductive layer,
    wherein the at least one of the insulating pillars has a height lower than the gate conductive layer and higher than the surface of the semiconductor substrate.

8. The vertical-type semiconductor apparatus of claim 7, further comprising:
    a source contact electrically coupled to the semiconductor substrate and vertically extending from the surface of the semiconductor substrate, in a third region of the semiconductor substrate.

9. The vertical-type semiconductor apparatus of claim 8, wherein the second region is defined to be adjacent to the first region in a horizontal direction, and the third region is defined to be adjacent to the second region in the horizontal direction.

10. A method of fabricating a vertical-type semiconductor apparatus, the method comprising:
    forming an inactive region having a first depth in a semiconductor substrate and formed from a surface thereof;
    forming hard mask patterns on the semiconductor substrate including the inactive region and forming a plurality of pillars by patterning the semiconductor substrate and the inactive region to a second depth;
    forming a gate conductive layer on an outer circumference of each of the plurality of pillars;
    forming a first insulating layer on the semiconductor substrate including the gate conductive layer and planarizing the first insulating layer;
    forming a gate contact hole by removing at least one of pillars formed on the inactive region to have a height lower than the gate conductive layer; and
    forming a gate contact by burying a conductive material in the gate contact hole.

11. The method of claim 10, wherein the vertical-type semiconductor substrate includes a first region adjacent to one side of the inactive region and a second region adjacent to the other side of the inactive region.

12. The method of claim 11, further comprising:
    removing a structure formed on the semiconductor substrate of the second region to expose the semiconductor substrate; and
    forming a source contact coupled with the exposed semiconductor substrate and extending vertically from the surface of the semiconductor substrate.

13. The method of claim 11, further comprising:
    removing the hard mask patterns formed in the first region; and
    forming a data storage unit in a space from which each hard mask pattern is removed.

14. The method of claim 10, wherein the first depth is lower than the second depth from the surface of the semiconductor substrate.

15. The method of claim 10, further comprising:
    forming a second insulating layer on an outer circumference of a lower end of the each of the plurality of pillars,
    wherein the gate conductive layer is formed on the insulating layer.

16. A method of fabricating a vertical-type semiconductor apparatus, the method comprising:
    forming hard mask patterns on a semiconductor substrate in which a first region and a second region are defined, and forming a plurality of pillars by patterning the semiconductor substrate;
    forming an inactive region of a first height to surround a lower end of each of the plurality of pillars;
    forming a gate conductive layer of a second height on the inactive region to surround the pillar;

forming an insulating layer on the semiconductor substrate including the gate conductive layer and planarizing the insulating layer;

forming a gate contact hole by etching at least one of pillars formed in the second region to have a height lower than the gate conductive layer; and forming a gate contact by burying a conductive material in the gate contact hole.

17. The method of claim 16, wherein the first region is adjacent to one side of the second region, and the semiconductor substrate includes a third region adjacent to the other side of the second region.

18. The method of claim 17, further comprising:

removing a structure formed on the semiconductor substrate of the third region to expose the semiconductor substrate; and forming a source contact coupled with the exposed semiconductor substrate and extending vertically from the surface of the semiconductor substrate.

19. The method of claim 16, further comprising:

removing the hard mask patterns formed in the first region; and forming a data storage unit in a space from which each hard mask pattern is removed.

* * * * *